United States Patent [19]

Niimi

[11] 4,361,908
[45] Nov. 30, 1982

[54] CHANNEL SEARCH AND SELECTION SYSTEM FOR TELEVISION RECEIVER

[75] Inventor: Hirohide Niimi, Yokohama, Japan

[73] Assignee: Hitachi, Ltd., Tokyo, Japan

[21] Appl. No.: 214,414

[22] Filed: Dec. 8, 1980

[30] Foreign Application Priority Data

Dec. 6, 1979 [JP] Japan .................................. 54/157402

[51] Int. Cl.³ .......................... H03J 7/02; H03J 7/22; H04N 5/50
[52] U.S. Cl. .................................... 455/164; 455/169; 455/192; 358/193.1; 358/195.1
[58] Field of Search ........................ 358/193.1, 195.1; 455/164, 169, 182, 192, 195, 262-264

[56] References Cited

U.S. PATENT DOCUMENTS

| | | | |
|---|---|---|---|
| 3,737,787 | 6/1973 | Wolfram | 455/164 |
| 3,753,172 | 8/1973 | Sakamoto | 455/195 |
| 3,968,441 | 7/1976 | Garskamp | 455/169 |
| 3,980,968 | 9/1976 | Ma | 455/195 |
| 4,240,115 | 12/1980 | Kamiya | 358/193.1 |
| 4,295,165 | 10/1981 | Watanabe et al. | 358/193.1 |

Primary Examiner—Jin F. Ng
Attorney, Agent, or Firm—Antonelli, Terry & Wands

[57] ABSTRACT

A channel search and selection system for a televison receiver, using a voltage synthesizer system, comprises a channel selection voltage generator for producing a continuously changing control voltage, an electronic tuner which receives this control voltage and a television signal of a channel corresponding to the control voltage to convert the television signal to an intermediate frequency signal, an amplifier for receiving and amplifying the intermediate frequency signal, and a frequency discriminator for receiving the amplified intermediate frequency signal and producing an output voltage according to the degree of deviation of the intermediate frequency signal from a predetermined frequency. This output voltage is fed to the channel selection voltage generator circuit for controlling the control voltage. The system also comprises a television signal state discriminator for detecting whether or not the electronic tuner is correctly receiving a television signal and producing an output signal when it is not, and a voltage holding means for receiving the output signal produced from the television signal state discriminator circuit and also the control voltage supplied from the channel selection voltage generator circuit and preventing the variation of the control voltage during the presence of the output signal from the television signal state discriminator circuit. Thus, even when the television signal of the selected channel temporarily vanishes or is reduced in its intensity level, the control voltage supplied to the electronic tuner does not vary, so the electronic tuner is held ready for again receiving the selected channel television signal.

2 Claims, 5 Drawing Figures

CHANNEL SEARCH AND SELECTION SYSTEM FOR TELEVISION RECEIVER

BACKGROUND OF THE INVENTION

This invention relates to channel search and selection systems for television receivers, and more particularly, to a channel search and selection system, in which channels are searched and selected according to a variable d.c. voltage supplied to an electronic tuner.

As the channel selector of a television receiver is frequenctly operated, it should be readily operable and have high reliability and durability. Electronic tuners of the television receiver do not have mechanical contacts and permit the reception of television signals of desired channels with a variable turning voltage. Thus, the channel selector using an electronic tuner permits the reception of a television signal of a desired channel through a variation of a tuning voltage caused by operating a simple pushbutton switch or touch switch. In addition to the ready operation, it is superior in reliability since it operates electronically. As a channel search and selection system using an electronic tuner, there is a voltage synthesizer system disclosed in U.S. Pat. No. 4,240,115 which is assigned to the assignee of the present invention. In this system, a tuning voltage supplied to an electronic tuner is continuously varied and, when a television signal of a channel is received, the tuning voltage is held at the value of this instant, stopping the tuning voltage variation, whereby this channel is steadily received. This voltage synthesizer system is usually provided with an automatic frequency control function. The automatic frequency control is effected as the output signal of a frequency discriminator, which detects the frequency of an i-f signal output of the electronic tuner converting a television signal thereto, is fed back to the electronic tuner. In other words, when the i-f signal from the electronic tuner does not have a frequency coincident with a predetermined frequency, the frequency discriminator supplies such an output signal to the electronic tuner as to control the tuning voltage so that the i-f signal has a frequency coincident with the predetermined frequency. So long as the coincidence of the i-f signal frequency with the predetermined frequency is obtained, the television signal is correctly and steadily received.

FIG. 1 is a block diagram of a television receiver provided with a voltage synthesizer channel search and selection system. The receiver comprises an electronic tuner 2 connected to an antenna, an i-f amplifier 3 connected to the tuner 2, a video detector 4 connected to the i-f amplifier 3, a video amplifier 5 connected to the video detector 4, a cathode-ray tube (hereinafter referred to as a CRT) 6 connected to the video amplifier 5, a sync separator 7 connected to the video detector 4, a deflection circuit 8 connected to the sync separator 7, a frequency discriminator 9 connected to the i-f amplifier 3, and a channel selection voltage generator circuit 10 connected to the sync separator 7, the deflection circuit 8 and the frequency discriminator 9. The electronic tuner 2 converts a television signal intercepted by the antenna 2 to an i-f signal which is fed to the i-f amplifier 3. The i-f amplifier 3 amplifies the i-f signal, and its output is fed to the video detector 4 and also to the frequency discriminator 9. The video detector 4 detects the i-f signal input to reproduce a composite television signal containing video signal and sync signals. The composite signal thus obtained is fed to the video amplifier 5 and also to the sync separator 7. The video amplifier 5 amplifies the video signal, and its output is fed to the CRT 6 for display as image reproduction thereon. The sync separator 7 separates the sync signal from the composite signal, and the separated sync signal is fed to the channel selection voltage generator circuit 10 and also to the deflection circuit 8. The deflection circuit 8 deflects the electron beam produced in the CRT 6, and at the same time, produces flyback pulses (i.e., retrace pulses) which are fed to the channel selection voltage generator circuit 10. The frequency discriminator 9 detects the frequency of the i-f signal to produce an output signal varying depending on whether the i-f signal frequency is higher or lower than a predetermined frequency. The detection of the discriminator 9 is fed to the channel selection voltage generator circuit 10. The function of the channel selection voltage generator circuit 10 will be described hereinafter in detail.

FIG. 2 shows the detailed circuit construction of the channel selection voltage generator circuit shown in FIG. 1. It includes a buffer circuit 11, a Schmitt circuit 12, a sync discriminator circuit 13, AND gates 14 and 15, NOR gates 16 and 17, NAND gates 18 and 19, an inverter 20, set-reset type flip-flops (hereinafter referred to as SRFF) 21 and 22, a tuning voltage generator 22, which has a capacitor 24 for delivering a tuning voltage, a first constant current circuit 25 for supplying a charging current to the capacitor 24 and a second constant current circuit 26 for causing a discharge current from the capacitor 24, pushbutton switches 27 and 28 for causing tuning operations, and resistors 29 and 30.

The sync discriminator circuit 13 receives the sync signal output b from the sync separator 7 (FIG. 1) and the flyback pulse output c from the deflection circuit 8 (FIG. 1). When these signals b and c are synchronized with each other, the sync discriminator circuit 13 produces at an output terminal X a logical level "1" signal and at an output terminal Y a logical level "0" signal, while when the signals b and c are not synchronized the circuit 13 produces a logical level "0" signal at the terminal X and a logical level "1" signal at the terminal Y. When receiving a level "1" signal from the NOR gate 17, the first constant current circuit 25 supplies a current I to the capacitor 24 for charging the capacitor 24, while when receiving a level "0" signal from the gate 17 the circuit 25 supplies no current. The second constant current circuit 26 causes a current of a value I/2 unless the terminal voltage across the capacitor 24 is zero. The voltage across the capacitor 24 is delivered from a terminal D to the electronic tuner 2. To a terminal A, the output voltage a of the frequency discriminator 9 is applied. The buffer circuit 11 produces an output signal at level "1" when the voltage a is higher than a first predetermined voltage $E_1$, and produces an output signal at level "0" when the voltage a is lower than $E_1$. The Schmitt circuit 12 has a hysteresis characteristic, and it produces an output signal at level "1" when the voltage a increases higher than a second predetermined voltage $E_2$ and subsequently produces an output signal at a level "0" when the voltage a decreases lower than a third predetermined voltage $E_3$ which is lower than the voltage $E_2$. Usually, the first voltage $E_1$ mentioned above is lower than the second voltage $E_2$ and higher than the third voltage $E_3$.

The pushbutton switches 27 and 28 are provided for selecting a channel other than that under receiption.

For example, when the pushbutton 27 is turned on, a switching is effected from a first channel to a second channel, while when the pushbutton switch 28 is turned on a switching is effected from the second channel to the first channel. More particularly, when the switch 27 is turned on, the tuning voltage being delivered from the termfinal D to the electronic tuner 2 is increased, while when the switch 28 is turned on the tuning voltage being delivered to the tuner 2 is decreased.

The function of the channel selection voltage generator circuit 10 will now be described. It is assumed that the electronic tuner 2 is receiving the television signal of a certain channel with a tuning voltage delivered thereto from the tuning voltage generator circuit 23. In this state, a voltage substantially equal to the first voltage $E_1$, i.e., the threshold voltage of the buffer circuit 11, appears at the terminal A. Also, the sync signal output b appears at terminal B, and the flyback pulse output c at terminal C, these signals being synchronized with each other. Further, the SRFFs 21 and 22 are reset so that their output signals are at level "0".

In this state, if the voltage a applied to the terminal A becomes lower than the first voltage $E_1$ or the threshold voltage of the buffer circuit 11 at a time t, the output signal of the buffer circuit 11 is inverted to a "0" level signal, the output signal of the NOR gate 16 is inverted to a "1" level signal, the output signal of the NOR circuit 17 is inverted to a "0" level signal, and the current from the constant current circuit 25 is cut off. As a result, the capacitor 24 is discharged through the constant current circuit 26 to reduce the voltage at the terminal D. With the reduction of the voltage at the terminal D, i.e., the tuning voltage, the frequency of the i-f signal from the electronic tuner 2 is reduced to increase the output voltage a of the frequency discriminator 9. In other words, when the output voltage a becomes lower than the threshold voltage of the buffer circuit 11, the feedback loop functions to increase the voltage a, so that until the voltage a eventually reaches the threshold voltage of the buffer circuit 11, the logical level of the output signal of the buffer circuit 11 is not inverted to the "1" level to invert the output signal of the NOR gate 16 to the "0" level signal and invert the output signal of the NOR gate 17 to the "1" level signal, thus turning on the constant current circuit 25 again for charging the capacitor 24. As a result, the voltage at the terminal D, i.e., the tuning voltage, is no longer reduced and turns to increase, thus generally increasing the frequency of the i-f signal from the electronic tuner. With the gradual increase of the i-f signal frequency the output voltage a is reduced again and eventually becomes lower than the threshold voltage of the buffer circuit 11 to cut off the constant current circuit 25 again. In the above way, the voltage at the terminal D is held substantially at the constant voltage $E_1$ with slight periodic changes, so that the electronic tuner 2 can correctly receive the television signal. The above function is the automatic frequency control function. Of the current I from the constant current circuit 25, one half flows through the constant current circuit 26, and the other half is supplied to the capacitor 24.

The selection of a channel is effected by operating the pushbutton switch 27 or 28. When the pushbutton switch 27 is turned on, the SRFF 21 is set, and its output signal level is now at "1", thus rendering the output signal of the NOR gate 16 to be at "0" level and the output signal of the NOR gate 17 to be at "1" level. As a result, current is caused through the constant voltage circuit 25. At this time, the output of the NOR gate 17 is at "1" level regardless of the amplitude of the output signal a supplied from the frequency discriminator 9 to the terminal A, and the voltage at the terminal D is increased so that the reception is no longer possible of the television signal that has been received by the electronic tuner 2. Accordingly, the electronic tuner 2 stops production of the i-f signal, and the signal voltage a applied to the terminal A is changed to greatly differ from the voltage $E_1$. During this course, the output signal of the Schmitt circuit 12 is changed to be at "0" level. Also, with the vanishment of the i-f signal the sync signal also vanishes, so that the output signal at the terminal X of the sync discriminator circuit 13 is changed to be at "0" level. With a further increase of the voltage at the terminal D, the electronic tuner 2 comes to receive a television signal of a different channel to produce again the i-f signal. As a result, the voltage $E_2$ is applied again to the terminal A to cause the output signal of the Schmitt circuit 12 to be at "1" level and also the output signal at the terminal X of the sync separator circuit 13 to be at "1" level, thus resetting the SRFF 21 to render the output signal thereof to be at "0" level. After the inversion of the output signal of the SRFF 21 to the "0" level signal, the constant current circuit 25 is gain controlled according to the voltage a applied to the terminal A.

When the pushbutton switch 28 is closed, the SRFF 22 is set, and the output signal of the NOR gate 17 is caused to be at "0" level irrespective of the voltage applied to the terminal A, thus cutting off the constant current circuit 25. As a result, the voltage at the terminal D is gradually reduced for searching a television signal of a different channel.

As has been shown, the channel search and selection system based upon a voltage synthesizer is simple in construction and can be readily provided with the automatic frequency control function, so that it is extensively used in practice. However, this system is not provided with any means for storing the voltage appearing at the terminal D, i.e., the tuning voltage supplied to the electronic tuner 2. Therefore, when the television signal being received temporarily vanishes or when the intensity of the television signal is temporarily reduced, the tuning voltage, i.e., voltage at the terminal D, is readily changed. If this happens, it is liable to occur that the electronic tuner 2 can no longer correctly receive the television signal even with a subsequent interception of the television signal by the antenna 1. This is because without the i-f signal supplied to the frequency discriminator 9, the circuit 9 generates a specific output voltage $V_0$, which is applied to the channel selection voltage generator circuit 10. If this voltage $V_0$ is higher than the threshold voltage of the buffer circuit 11, the voltage at the terminal D is increased, while if it is lower than the threshold voltage the voltage at the terminal D is reduced. This results in the reception of a television signal of another channel as in the case when the pushbutton switch 27 or 28 is closed.

Furthermore, since sync discriminator circuit 13 and Schmitt circuit 12 are both provided for the purpose of ensuring accurate determination of the operation state of the electronic tuner 2 such that the tuner 2 receives a television signal, one of them may be omitted.

SUMMARY OF THE INVENTION

It is an object of the invention to provide an improved channel search and selection system using a voltage synthesizer.

Another object of the invention is to provide a channel search and selection system, in which the output signal of a tuning voltage generator circuit is not changed even when the television signal being received vanishes temporarily or when the intensity of the television signal is suddenly reduced, so that the television signal of the same channel as has been received so far can be received from the time of a subsequent interception of the televison signal by the antenna.

With the prior art channel searach and selection system having a voltage synthesizer, the tuning voltage may be changed when the television signal vanishes or when the intensity thereof is reduced, thus leading to the malfunction. According to the invention, means for detecting the vanishment of a television signal or the reduction of the intensity thereof and means operated by a signal produced from the detecting means for preventing the change of the tuning voltage are incorporated in the channel search and selection system. The vanishment of a television signal or the reduction of the intensity thereof may be detected, for instance, from the output signal of the frequency discriminator or from the output signal of the sync separator. When the televison signal vanishes or is reduced in intensity, the electronic tuner no longer produces the i-f signal. When this happens, the output voltage of the frequency discriminator is changed to $V_0$, and the sync separator ceases to produce the sync signal. With the change of the output voltage of the frequency discriminator or the vanishment of the sync signal from the sync separator, the detecting means determines that the television signal has vanished or is reduced in intensity. As the means for preventing the change of the tuning voltage, a third constant current circuit is provided. This third constant current circuit causes the flow of the same amount of current out of the capacitor as the current that flows thereinto, that is, it cancels the current flowing into the capacitor. Thus, the capacitor is not charged, that is, the voltage across the capacitor, i.e., the tuning voltage, is not changed.

DESCRIPTION OF THE PREFERRED EMBODIMENTS

Figure 1:
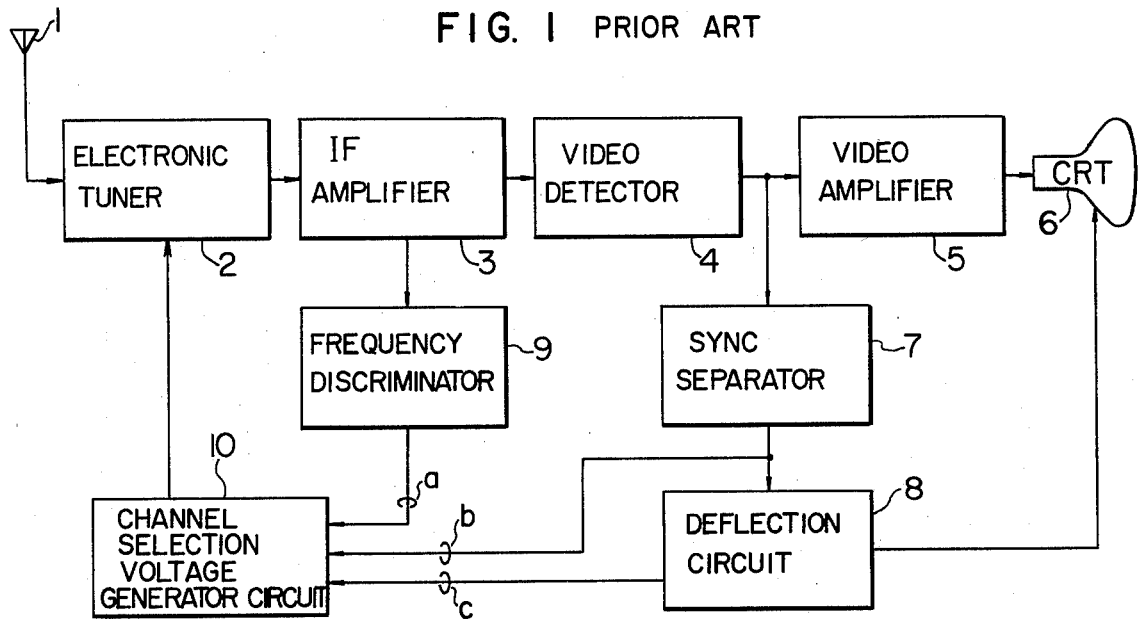
FIG. 1 is a block diagram outlining the circuit of a television receiver provided with a voltage synthesizer channel selection system.
Figure 2:
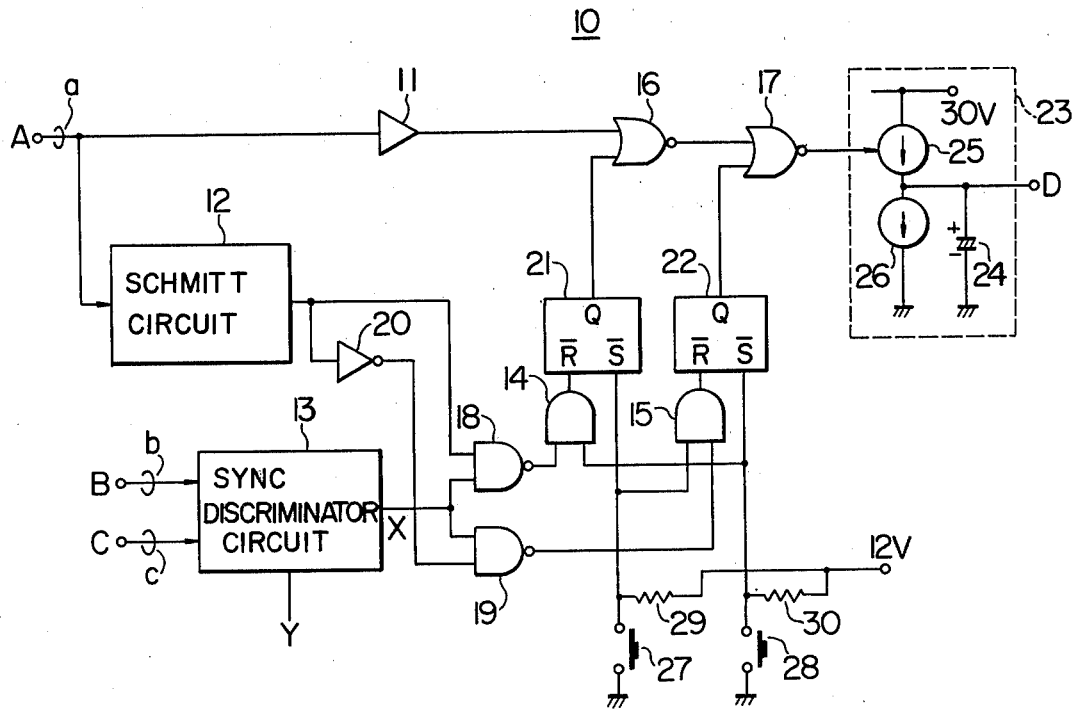
FIG. 2 is a circuit diagram showing a voltage synthesizer channel selection system of the type disclosed in U.S. Pat. No. 4,240,115.
Figure 3A:
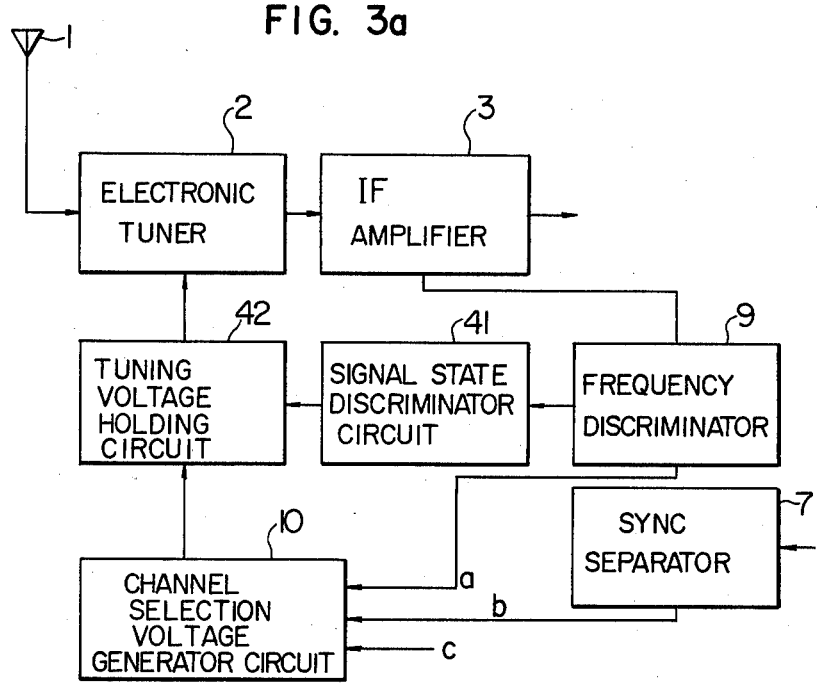
FIGS. 3a and 3b are views illustrating the principle of the channel search and selection system according to the invention.
Figure 3B:
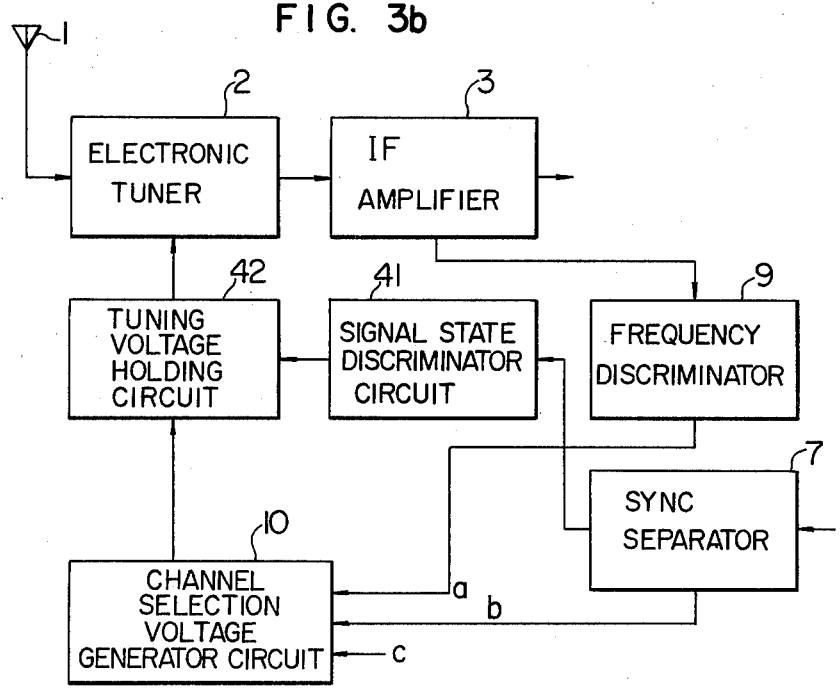

FIGS. 3a and 3b are block diagrams of systems underlying the principle of the invention. Basically, the channel search and selection system according to the invention is provided with a television signal state discriminator circuit 41 and a tuning voltage holding circuit 42. The state discriminator circuit 41 receives the output signal of either the frequency discriminator 9 or sync separator 7, and it determines whether the electronic tuner 2 is correctly receiving a television signal. When the television signal vanishes or is reduced in intensity, the output signal of the frequency discriminator 9 is changed to $V_0$ while the sync separator circuit 7 ceases to produce the sync signal output. The state discriminator circuit 41 determines that the television signal has vanished or is reduced in level when the frequency discriminator 9 supplies the voltage $V_0$ or when the sync separator circuit 7 ceases to supply the sync signal. When it makes this decision, it supplies an output signal to the tuning voltage holding circuit 42. When the tuning voltage holding circuit 42 receives the output signal from the state discriminator circuit 41, it holds the tuning voltage being supplied from the tuning voltage generator circuit 10 to the electronic tuner 2. Thus, the electronic tuner 2 can be held such that it does not receive any other channel and is ready for receiving again the same channel as before.

Figure 4:
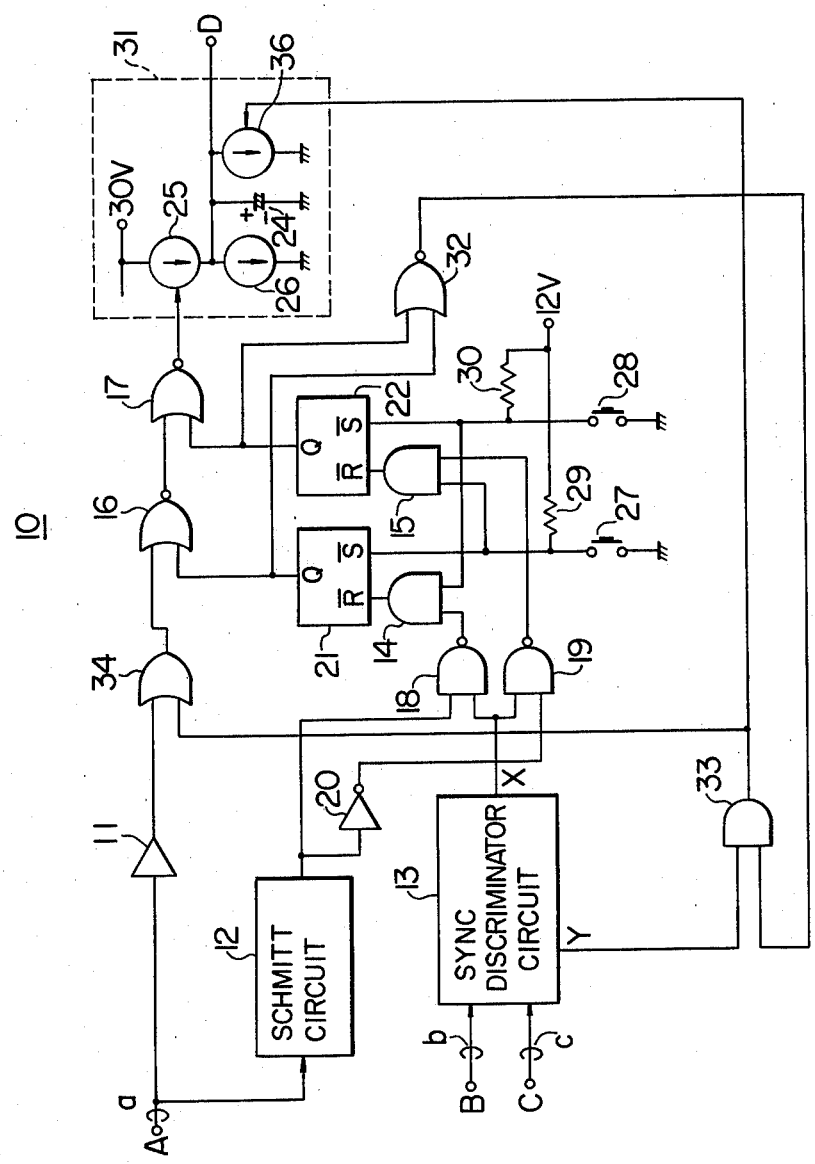
FIG. 4 is a circuit diagram showing a voltage synthesizer channel selection system according to the invention.

Now, a specific embodiment of the channel search and selection system according to the invention will be described with reference to FIG. 4. In the system shown in FIG. 4 according to the invention, a NOR gate 32 has its input terminals connected to the outputs of the SRFFs 21 and 22, an AND gate 33 has its input terminals connected to Y terminal of the sync discriminator 13 and to the output of the NOR gate 32, an OR gate 34 has its input terminals connected to the output of the buffer circuit 11 and to the output of the AND gate 33, and a constant current circuit 36 is connected in parallel with the constant current circuit 26 and is driven by the output of the AND gate 33. The output of the OR gate 34 is fed to the NOR gate 16. When a signal at "1" level is supplied from the AND gate 33, a current I/2 is caused to flow in the constant current circuit 36 as in the constant current circuit 26. The output signal of the NOR gate 32 is fed to the AND gate 33, and the output signal of the gate 33 is fed to the OR gate 34 and also to the constant current circuit 36. The television signal state discriminator circuit 41 mentioned above is constituted by the sync signal discriminator circuit 13, and the tuning voltage holding circuit 42 mentioned above is constituted by the constant current circuit 36 and the AND gate 33.

When the electronic tuner 2 is correctly receiving a television signal, the output signals at the output terminals X and Y of the sync discriminator circuit 13 are respectively at levels "1" and "0", the output signals of the SRFFs 21 and 22 are both at level "0", and the output signal of the NOR gate 32 is at level "1". Thus, the output signal of the AND gate 33 is at level "0", and no current is flowing through the constant current circuit 36. Further, the output signal of the buffer circuit 11 if fed through the OR gate 34 to the NOR gate 16. Thus, the channel selection voltage generator circuit 10 operates entirely in the same manner as in the prior art system described above.

When a television signal of a channel having been received vanishes or is reduced in intensity level, the electronic tuner 2 ceases to produce the i-f signal. Then, the video detector 4 ceases to reproduce the video signal, and the output of the sync separator circuit 7 no longer contains any sync signal. As a result, the output signal at the terminal Y of the sync discriminator circuit 13 is caused to be at level "1". Since at this time the output signal of the NOR gate 32 is at the level "1", the output signal of the AND gate 33 is now at level "1", thus turning on the constant current circuit 36 to cause current to flow therein. At this time, the OR gate 34 supplies an output signal at level "1" irrespective of the level of the output signal of the buffer circuit 11 since the output signal of the AND gate 33 is fed to the OR gate 34. As a result, the constant current circuit 25 is turned on. Since both the constant current circuits 26 and 36 are turned on, the current I that is caused to flow through the constant current circuit 25 is entirely shared between the constant current circuits 26 and 36, each of which carries a current I/2. Thus, the capacitor 24 is neither charged nor discharged that is, the voltage across the capacitor 24 is held at the value immediately before the vanishment or level reduction of the television signal. Since the voltage across the capacitor 24 is the output voltage of the tuning voltage generator 31, i.e., the tuning voltage, the electronic tuner 2 is ready for receiving the television signal of the same channel as before as soon as the normal state of the television signal is recovered, and it will not receive any other channel television signal. When the television signal is received again, the output signal at the terminal Y of the sync discriminator circuit 13 and the output signal of the AND gate 33 are caused to be at level "0" again to turn off the constant current circuit 36, so that the tuning voltage generator 31 is again controlled according to the voltage a fed to the terminal A. If the current flowing through the constant current circuits 26 and 36 is not strictly I, the voltage across the capacitor 24 may slightly change in general, but it is ready to construct the circuit with such a precision that no practical problems arise in this respect.

When the pushbutton 27 or 28 is closed, the output signl of the SRFF 21 or 22 is caused to be at level "1" to invert the output signals of the NOR gate 32 and AND gate 33 to be at level "0", so that the channel selection voltage generator circuit 10 operates in the same manner as in the prior art system.

In the above embodiment, when the output signal at the terminal Y of the sync signal discriminator circuit 13 is inverted to be at level "1", the tuning voltage generator circuit 10 determines that the television signal has vanished or is reduced in intensity level and turns on the constant current circuit 36. However, it is possible to detect the vanishment or intensity level reduction of the television signal by other means as well. For instance, with the vanishment of the television signal the output voltage of the sync discriminator circuit 9 is changed to $V_0$. Thus, it is possible to achieve the objective of the channel search and selection system according to the invention by arranging such as to turn on the constant current circuit 36 in response to the detection of the voltage $V_0$ supplied to the terminal A.

As has been described in the foregoing, since according to the invention the output voltage of the channel selection voltage generator circuit, i.e., the tuning voltage supplied to the tuner, is held and prevented from variation when the vanishment or intensity level reduction of the television signal is detected, it is possible to obtain correct reception of the television signal again when the normal state thereof is recovered. Thus, the invention can sufficiently overcome the drawback inherent in the prior art channel search and selection system using the voltage synthesizer.

I claim:

1. A channel search and selection system for a television receiver comprising:

(1) a channel selection voltage generator circuit for producing a continuously changing control voltage;

(2) an electronic tuner for receiving said control voltage produced from said channel selection voltage generator circuit to receive a television signal of a channel corresponding to said control voltage and converting said television signal to an intermediate frequency signal;

(3) an amplifier for receiving and amplifying said intermediate frequency signal produced from said electronic tuner;

(4) a frequency discriminator for receiving said amplified intermediate frequency signal from said amplifier and producing an output voltage according to the degree of deviation of the frequency of said intermediate frequency signal from a predetermined frequency, said output voltage being fed to said channel selection voltage generator circuit for controlling said control voltage produced therefrom;

(5) a television signal state discriminator circuit for indirectly detecting the state of the television signal being received by said electronic tuner, said television signal state discriminator circuit receiving the output signal from said frequency discriminator and producing an output signal when the output of the frequency discriminator reaches a predetermined voltage; and (6) voltage holding means connected to said channel selection voltage generator circuit, said voltage holding means receiving the output signal from said television signal state discriminator circuit and preventing variations of said control voltage supplied from said channel selection voltage generator circuit to said electronic tuner during the presence of the output signal from said television signal state discriminator circuit, wherein (1) said channel selection voltage generator circuit includes:

(a) a capacitor for producing said control voltage;

(b) a first constant current circuit for supplying a first constant current to said capacitor;

(c) a second constant current circuit connected to said capacitor for causing a second constant current less than said first constant current to flow to discharge said capacitor; and (d) a control circuit for detecting the level of the output voltage fed from said frequency discriminator and rendering said first constant current circuit conductive or non-conductive by producing a first detection signal when said output voltage is higher than a predetermined first voltage and producing a second detection signal when said output voltage is lower than said first voltage; and wherein (2) said voltage holding means includes:

(a) a third constant current circuit connected to said capacitor in said channel selection voltage generator circuit for causing a third current equal to the difference between said first constant current from said first constant current circuit and said second constant current from said second constant current circuit to flow; and (b) means for rendering said first and third constant current circuits conductive when said television signal state discriminator circuit produces the output signal and rendering said third constant current circuit non-conductive when said output signal vanishes.

2. A channel search and selection system for a television receiver comprising:
   (1) a channel selection voltage generator circuit for producing a continuously changing control voltage;
   (2) an electronic tuner for receiving said control voltage produced from said channel selection voltage generator circuit to receive a televison signal of a channel corresponding to said control voltage and converting said television signal to an intermediate frequency signal;
   (3) an amplifier for receiving and amplifying said intermediate frequency signal produced from said electronic tuner;
   (4) a frequency discriminator circuit for receiving said amplifier intermediate frequency signal from said amplifier and producing an output voltage according to the degree of deviation of the frequency of said intermediate frequency signal from a predetermined frequency, said output voltage being fed to said channel selection voltage generator circuit for controlling said control voltage produced therefrom;
   (5) a detector for receiving and detecting said amplified intermediate frequency signal from said amplifier;
   (6) a sync separator for receiving the television signal output from said detector circuit and separating a synchronization signal from said television signal output;
   (7) a television signal state discriminator circuit for indirectly detecting the state of the television signal being received by said electronic tuner, said television signal state discriminating circuit receiving the output signal from said sync separator and producing no output signal when said output signal from said sync separator contains said synchronization signal while producing an output signal when said output signal does not contain said synchronization signal; and
   (8) voltage holding means connected to said channel selection voltage generator circuit, said voltage holding means receiving the output signal from said television signal state discriminator circuit and preventing variations of said control voltage supplied from said channel selection voltage generator circuit to said electronic tuner during the presence of the output signal from said television signal state discriminator circuit, wherein
   (1) said channel selection voltage generator circuit includes:
      (a) a capacitor for producing said control voltage;
      (b) a first constant current circuit for supplying a first constant current to said capacitor;
      (c) a second constant current circuit connected to said capacitor for causing a second constant current less than said first constant current to flow to discharge said capacitor; and
      (d) a control circuit for detecting the level of the output voltage fed from said frequency discriminator and rendering said first constant current circuit conductive or non-conductive by producing a first detection signal when said output voltage is higher than a predetermined first voltage and producing a second detection signal when said output voltage is lower than said first voltage; and wherein
   (2) said voltage holding means includes:
      (a) a third constant current circuit connected to said capacitor in said channel selection voltage generator circuit for causing a third current equal to the difference between said first constant current from said first constant current circuit and said second constant current from said second constant current circuit to flow; and
      (b) means for rendering said first and third constant current circuits conductive when said television signal state discriminator circuit produces the output signal and rendering said third constant current circuit non-conductive when said output signal vanishes.

* * * * *